(12) United States Patent
Dai

(10) Patent No.: US 12,159,884 B2
(45) Date of Patent: Dec. 3, 2024

(54) ARRAY SUBSTRATE, METHOD OF MANUFACTURING SAME, AND DISPLAY PANEL

(71) Applicant: Shenzhen China Star Optoelectronics Semiconductor Display Technology Co., Ltd., Shenzhen (CN)

(72) Inventor: Xingqiang Dai, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/605,072

(22) PCT Filed: Sep. 30, 2021

(86) PCT No.: PCT/CN2021/122260
§ 371 (c)(1),
(2) Date: Oct. 20, 2021

(87) PCT Pub. No.: WO2023/044957
PCT Pub. Date: Mar. 30, 2023

(65) Prior Publication Data
US 2024/0055444 A1    Feb. 15, 2024

(30) Foreign Application Priority Data

Sep. 24, 2021 (CN) .......................... 202111120422.9

(51) Int. Cl.
*H01L 27/12* (2006.01)
*G02F 1/1362* (2006.01)
*G02F 1/1368* (2006.01)

(52) U.S. Cl.
CPC .... *H01L 27/1248* (2013.01); *G02F 1/136227* (2013.01); *G02F 1/1368* (2013.01); *H01L 27/1288* (2013.01)

(58) Field of Classification Search
CPC ............ H01L 27/1248; H01L 27/1288; G02F 1/136227; G02F 1/1368; G02F 1/133345; H01J 2329/4669; H01J 2329/4673
See application file for complete search history.

(56) References Cited

U.S. PATENT DOCUMENTS

2012/0146033 A1*   6/2012   Lee ..................... H01L 27/1248
                                                                438/34
2014/0084264 A1    3/2014   Lee
(Continued)

FOREIGN PATENT DOCUMENTS

CN    104022076 A    9/2014
CN    104022077 A    9/2014
(Continued)

OTHER PUBLICATIONS

International Search Report in International application No. PCT/CN2021/122260, mailed on Jun. 20, 2022.
(Continued)

*Primary Examiner* — Mariam Qureshi
(74) *Attorney, Agent, or Firm* — Nathan & Associates; Menachem Nathan

(57) ABSTRACT

The present application discloses an array substrate, a method of manufacturing the same, and a display panel. The method of manufacturing the array substrate includes: providing a substrate; sequentially stacking an active layer, a gate insulating layer, and a gate on the substrate and patterning the active layer, the gate insulating layer, and the gate with a photomask to form an active portion, a gate insulating portion, and a gate portion stacked in sequence; and providing an interlayer dielectric layer on the substrate, the active portion, the gate insulating portion, and the gate portion.

12 Claims, 6 Drawing Sheets

(56) References Cited

U.S. PATENT DOCUMENTS

| | | | |
|---|---|---|---|
| 2016/0195785 A1* | 7/2016 | Kimura | G02F 1/1368 349/43 |
| 2016/0300866 A1* | 10/2016 | Long | H01L 21/26513 |
| 2017/0271374 A1* | 9/2017 | Zhang | H01L 29/45 |

FOREIGN PATENT DOCUMENTS

| | | |
|---|---|---|
| CN | 105097845 A | 11/2015 |
| CN | 105428313 A | 3/2016 |
| CN | 105655359 A | 6/2016 |
| CN | 105762195 A | 7/2016 |
| CN | 109148539 A | 1/2019 |
| CN | 110993651 A | 4/2020 |
| WO | 2020206707 A1 | 10/2020 |

OTHER PUBLICATIONS

Written Opinion of the International Search Authority in International application No. PCT/CN2021/122260, mailed on Jun. 20, 2022.

Chinese Office Action issued in corresponding Chinese Patent Application No. 202111120422.9 dated Jan. 20, 2023, pp. 1-8.

* cited by examiner

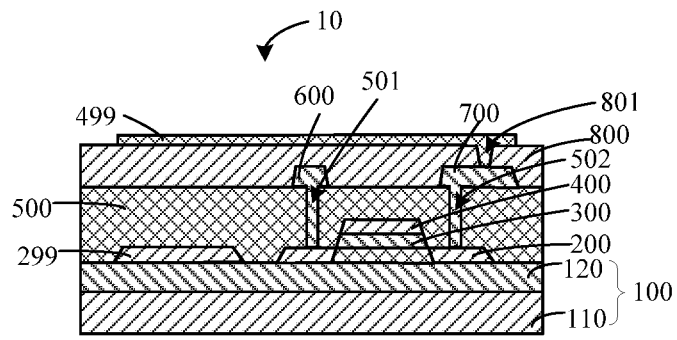

FIG. 1 providing a substrate. — B11

sequentially stacking an active layer, a gate insulating layer, and a gate on the substrate, and patterning the active layer, the gate insulating layer, and the gate with a photomask to form an active portion, a gate insulating portion, and a gate portion, wherein the active portion, the gate insulating portion, and the gate portion are stacked in sequence. — B12

providing an interlayer dielectric layer on the substrate, the active portion, the gate insulating portion, and the gate portion. — B13

FIG. 2

ARRAY SUBSTRATE, METHOD OF MANUFACTURING SAME, AND DISPLAY PANEL

BACKGROUND OF INVENTION

Field of Invention

The present application relates to a field of display technology, and in particular to an array substrate, a method of manufacturing the same, and a display panel.

Description of Prior Art

A thin film transistor (TFT) is a key driving element of a display. Manufacturing processes of the TFT determine display quality and cost of the display.

Current mainstream TFT structures mainly include a back channel etch (BCE) type and a top gate (TG) type. For a BCE-type TFT, because a back channel of a semiconductor layer is easily damaged during etching a source/drain (S/D) electrode, it is usually difficult to achieve optimal device performance. For a TG-type TFT, the semiconductor layer is covered and protected by an insulating layer after patterning, followed by depositing and patterning the S/D, thereby preventing damage to the semiconductor layer during patterning the S/D. Therefore, performance of the TG-type TFT device can achieve a very high degree of excellence. However, at present, multiple photomasks are required to prepare TG-type TFT devices, making a preparation process complicated and manufacturing cost relatively high.

SUMMARY OF INVENTION

Embodiments of the present application provide an array substrate, a method of manufacturing the same, and a display panel, so as to save a number of photomasks.

The present application provides a method of manufacturing an array substrate, including:
  providing a substrate;
  sequentially stacking an active layer, a gate insulating layer, and a gate on the substrate, and patterning the active layer, the gate insulating layer, and the gate with a photomask to form an active portion, a gate insulating portion, and a gate portion, wherein the active portion, the gate insulating portion, and the gate portion are stacked in sequence; and
  providing an interlayer dielectric layer on the substrate, the active portion, the gate insulating portion, and the gate portion.

Optionally, in some embodiments of the present application, the step of forming the active portion, the gate insulating portion, and the gate portion includes:
  sequentially stacking an active layer, a gate insulating layer, and a gate on the substrate, and patterning the active layer, the gate insulating layer, and the gate with a photomask, wherein the active layer forms the active portion and the first electrode plate; the gate insulating layer forms the gate insulating portion and an additional portion; the gate forms a metal portion and the gate portion; and the active portion, the gate insulating portion, and the gate portion are stacked in sequence; the first electrode plate, the additional portion, and the metal portion are stacked in sequence; the active portion, the gate insulating portion, and the gate portion are spaced apart from the first electrode plate, the additional portion, and the metal portion by a gap; and removing the additional portion and the metal portion.

Optionally, in some embodiments of the present application, the step of removing the additional portion and the metal portion includes:
  performing a first etching on the gate portion and the metal portion, removing the metal portion and a part of the gate portion to expose the additional portion and a part of the gate insulating portion; and
  performing a second etching on the additional portion and the gate insulating portion to remove the additional portion and the part of the gate insulating portion to expose the first electrode plate and a part of the active portion.

Optionally, in some embodiments of the present application, after exposing the first electrode plate and the part of the active portion, the method further includes:
  performing a conduction treatment on the first electrode plate and the part of the active portion to form a semiconductor region laminated with the gate insulating portion and a conduction region disposed around the semiconductor region on the active portion.

Optionally, in some embodiments of the present application, after providing the interlayer dielectric layer on the substrate, the active portion, the gate insulating portion, and the gate portion, the method further includes:
  performing a third etching on the interlayer dielectric layer to form a first through hole and a second through hole in the interlayer dielectric layer, wherein the first through hole and the second through hole are located at opposite sides of the gate portion, and the first through hole and the second through hole penetrate the interlayer dielectric layer to expose the conduction region of the active portion.

Optionally, in some embodiments of the present application, after the step of performing the third etching treatment on the interlayer dielectric layer, the method further includes:
  forming a metal layer on the interlayer dielectric layer, and patterning the metal layer to form a source and a drain, wherein the source extends into the first through hole to connect the active portion, and the drain extends into the second through hole to connect the active portion; and
  forming a passivation layer on the interlayer dielectric layer, the source, and the drain, and performing a fourth etching on the passivation layer to form a third through hole in the passivation layer, wherein the third through hole penetrates the passivation layer to expose the drain.

Optionally, in some embodiments of the present application, after the step of performing the fourth etching on the passivation layer, the method further includes:
  forming a conductive layer on the passivation layer, and patterning the conductive layer to form a pixel electrode, wherein the pixel electrode extends into the third through hole to connect the drain, an orthographic projection of the first electrode plate on the substrate falls within an orthographic projection of the pixel electrode on the substrate.

Optionally, in some embodiments of the present application, the step of providing the substrate includes:
  providing a substrate and forming a buffer layer on the substrate.

Optionally, in some embodiments of the present application, a material of the gate insulating layer includes one or a combination of silicon nitride, aluminum oxide, silicon oxynitride, and silicon oxide.

Optionally, in some embodiments of the present application, a material of the gate includes one or a combination of Mo, Cu, Al, and Ti.

Optionally, in some embodiments of the present application, the first etching is wet etching.

Optionally, in some embodiments of the present application, the second etching is dry etching.

Correspondingly, the present application also provides an array substrate, including:
- a substrate;
- an active portion and a first electrode plate disposed on the substrate in a same layer, wherein a gap is defined between the first electrode plate and the active portion;
- a gate insulating portion disposed on the active portion;
- a gate portion disposed on the gate insulating portion;
- an interlayer dielectric layer covering the substrate, the active portion, the gate insulating portion, and the gate portion; and
- a pixel electrode disposed on the interlayer dielectric layer, and an orthographic projection of the first electrode plate on the substrate falls within an orthographic projection of the pixel electrode on the substrate.

Optionally, in some embodiments of the present application, a first through hole and a second through hole are defined in the interlayer dielectric layer, the first through hole and the second through hole are located at opposite sides of the gate portion, and the first through hole and the second through hole penetrate the interlayer dielectric layer to expose the active portion.

Optionally, in some embodiments of the present application, the array substrate further includes a source and a drain disposed on the interlayer dielectric layer and respectively extend into the first through hole and the second through hole to connect an upper surface of the active portion.

Optionally, in some embodiments of the present application, the array substrate further includes a passivation layer disposed between the interlayer dielectric layer and the pixel electrode, the passivation layer is provided with a third through hole, and the third through hole penetrates the passivation layer to expose the drain.

Correspondingly, the present application also provides a display panel, wherein the display panel includes an opposite substrate, a liquid crystal layer, and an array substrate, the opposite substrate is spaced apart from the array substrate, and the liquid crystal layer is disposed between the array substrate and the opposite substrate, and wherein the array substrate includes:
- a substrate;
- an active portion and a first electrode plate disposed on the substrate in a same layer, wherein a gap is defined between the first electrode plate and the active portion;
- a gate insulating portion disposed on the active portion;
- a gate portion disposed on the gate insulating portion;
- an interlayer dielectric layer covering the substrate, the active portion, the gate insulating portion, and the gate portion; and
- a pixel electrode disposed on the interlayer dielectric layer, and an orthographic projection of the first electrode plate on the substrate falls within an orthographic projection of the pixel electrode on the substrate.

Optionally, in some embodiments of the present application, a first through hole and a second through hole are defined in the interlayer dielectric layer, the first through hole and the second through hole are located at opposite sides of the gate portion, and the first through hole and the second through hole penetrate the interlayer dielectric layer to expose the active portion.

Optionally, in some embodiments of the present application, the array substrate further includes a source and a drain disposed on the interlayer dielectric layer and respectively extend into the first through hole and the second through hole to connect to an upper surface of the active portion.

Optionally, in some embodiments of the present application, the array substrate further includes a passivation layer disposed between the interlayer dielectric layer and the pixel electrode, the passivation layer is provided with a third through hole, and the third through hole penetrates the passivation layer to expose the drain.

The present application discloses an array substrate, a method of manufacturing the same, and a display panel. The method of manufacturing the array substrate includes: providing a substrate; sequentially stacking an active layer, a gate insulating layer, and a gate on the substrate, and patterning the active layer, the gate insulating layer, and the gate with a photomask to form an active portion, a gate insulating portion, and a gate portion, wherein the active portion, the gate insulating portion, and the gate portion are stacked in sequence; and providing an interlayer dielectric layer on the substrate, the active portion, the gate insulating portion, and the gate portion. In the present application, the active portion, the gate insulating portion, and the gate portion are formed by one photomask, thereby simplifying a preparation process of the array substrate and preventing damage to the array substrate, thus reducing cost and improving performance of the array substrate. The orthographic projection of the first electrode plate on the substrate is set to fall within the orthographic projection of the pixel electrode on the substrate, so that the pixel electrode can also serve as the second electrode plate of a storage capacitor. In addition, the pixel electrode is formed of a transparent material, which can improve a transmittance of the array substrate, thereby improving the performance of the array substrate.

BRIEF DESCRIPTION OF DRAWINGS

In order to more clearly illustrate the technical solutions of the embodiments of the application, the drawings illustrating the embodiments will be briefly described below. Obviously, the drawings in the following description merely illustrate some embodiments of the present application. Other drawings may also be obtained by those skilled in the art according to these figures without paying creative work.

FIG. 1 is a schematic structural diagram of an array substrate provided by an embodiment of the present application.

FIG. 2 is a flowchart of a method of manufacturing the array substrate provided by an embodiment of the present application.

DETAILED DESCRIPTION OF PREFERRED EMBODIMENTS

Figure 3:
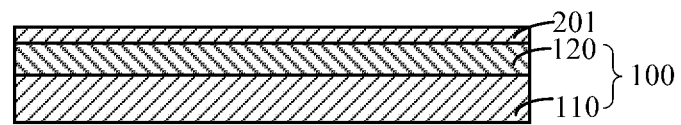
FIG. 3 is a first structural flowchart of the method of manufacturing the array substrate provided by an embodiment of the present application.
Figure 4:
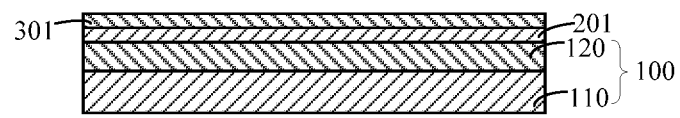
FIG. 4 is a second structure flowchart of the method of manufacturing the array substrate provided by an embodiment of the present application.
Figure 5:
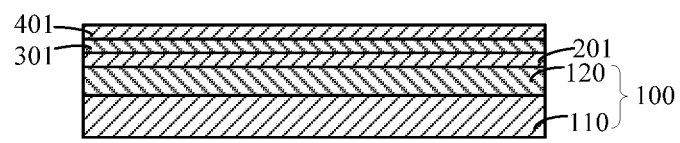
FIG. 5 is a third structural flowchart of the method of manufacturing the array substrate provided by an embodiment of the present application.
Figure 6:
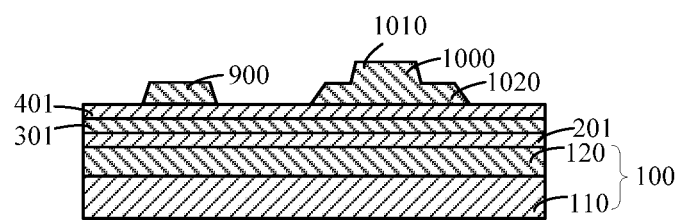
FIG. 6 is a fourth structural flowchart of the method of manufacturing the array substrate provided by an embodiment of the present application.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application. In addition, it should be understood that the specific implementations described here are only used to illustrate and explain the application, and are not used to limit the application. In the present application, unless otherwise stated, the orientation words used such as "upper" and "lower" generally refer to the upper and lower directions of the device in actual use or working state, and specifically refer to the drawing directions in the drawings, while "inner" and "outer" refer to the outline of the device.

Embodiments of the present application provide an array substrate, a method of manufacturing the same, and a display panel. Detailed descriptions are given below.

Referring to FIG. 1, FIG. 1 is a schematic structural diagram of an array substrate provided by an embodiment of the present application. The present application provides an array substrate 10. The array substrate 10 includes a substrate 100, an active portion 200, a first electrode plate 299, a gate insulating portion 300, a gate portion 400, a pixel electrode 499, and an interlayer dielectric layer 500.

The substrate 100 includes a base substrate 110 and a buffer layer 120. The buffer layer 120 is disposed on the base substrate 110. The base substrate 110 includes one or a combination of a rigid base substrate and a flexible base substrate. The rigid base substrate may be glass. A material of the flexible base substrate includes one or a combination of polyimide (PI), polycarbonate (PC), polyethersulfone (PES), polyethylene terephthalate (PET), polyethylene naphthalate (PEN), polyarylate (PAR), and glass fiber reinforced plastic (FRP). In the present application, the buffer layer 120 is provided in the substrate 100 to improve water and oxygen barrier performance of the substrate 100, and can improve flexibility of the substrate 100, thereby improving performance of the array substrate 10.

In an embodiment, a material of the buffer layer 120 includes one or several combinations of silicon nitride, aluminum oxide, silicon oxynitride, silicon oxide, methyl methacrylate, epoxy resin, polycarbonate, polystyrene, and phenolic resin.

In an embodiment, the substrate 100 may be formed by alternating layers of multiple base substrates 110 and buffer layers 120.

The active portion 200 and the first electrode plate 299 are arranged on the buffer layer 120 in a same layer. A gap is defined between the active portion 200 and the first electrode plate 299. The active portion 200 is provided with a semiconductor region and conduction regions arranged on opposite sides of the semiconductor region. In the present application, a source 600 and a drain 700 are in electrical contact with the conduction region of the active portion 200, thereby improving performance of the array substrate 10.

In an embodiment, a material of the active portion 200 includes an oxide containing one or a combination of In, Ga, Zn, Sn, Pr, Nd, Sc, and O. For example, a material of each of the active portion 200 and the first electrode plate 299 may be one or a combination of indium gallium zinc oxide, zinc oxide, and indium tin oxide. In this embodiment, the material of the active portion 200 is indium gallium zinc oxide.

In another embodiment, the material of each of the active portion 200 and the first electrode plate 299 includes one or a combination of amorphous silicon, polysilicon, and organic compounds.

The gate insulating portion 300 and the gate portion 400 are sequentially stacked in the semiconductor region on the active portion 200. A material of the gate insulating portion 300 includes one or a combination of silicon nitride, aluminum oxide, silicon oxynitride, and silicon oxide. A material of the gate portion 400 includes one or a combination of Mo, Cu, Al, and Ti.

In the prior art, the active portion needs to be formed by one photomask, and the gate insulating portion and the gate portion need to be formed by another photomask. That is, the array substrate in the prior art needs to be formed by multiple photomasks, so that a preparation process is complicated and a production cycle is long, which in turn increases cost; while in the present application, the active portion 200, the gate insulating portion 300, and the gate portion 400 are formed by a same photomask, which saves a number of photomasks, that is, a preparation process of the array substrate 10 is simplified, thereby reducing the cost. The active portion 200, the gate insulating portion 300, and the gate portion 400 are formed using a same photomask, which can prevent other layers in the array substrate from being damaged, thereby improving the performance of the array substrate 10.

The interlayer dielectric layer 500 covers the substrate 100, the active portion 200, the gate insulating portion 300, and the gate portion 400. The interlayer dielectric layer 500 is provided with a first through hole 501 and a second through hole 502. The first through hole 501 and the second through hole 502 are defined on opposite sides of the gate portion 400, and the first through hole 501 and the second through hole 502 penetrate the interlayer dielectric layer 500 to expose a conduction region of the active portion 200.

In an embodiment, the array substrate 10 further includes a source 600 and a drain 700. The source 600 and the drain 700 are disposed on the interlayer dielectric layer 500 and respectively extend into the first through hole 501 and the second through hole 502 to connect to an upper surface of the active portion 200.

In another embodiment, the source 600 and the drain 700 respectively extend into the first through hole 501 and the second through hole 502 to connect to a side surface of the active portion 200.

In an embodiment, the array substrate 10 further includes a passivation layer 800. The passivation layer 800 covers the interlayer dielectric layer 500, the source 600, and the drain 700. The passivation layer 800 is provided with a third through hole 801. The third through hole 801 penetrates the passivation layer 800 to expose the drain 700.

The pixel electrode 499 is disposed on the passivation layer 800 and extends into the third through hole 801 to connect to the drain 700. An orthographic projection of the first electrode plate 299 on the substrate 100 falls within an orthographic projection of the pixel electrode 499 on the substrate 100. The pixel electrode 499 can be used as a second electrode plate and form a storage capacitor with the first electrode plate 299.

In the present application, the orthographic projection of the first electrode plate 299 on the substrate 100 is set to fall within the orthographic projection of the pixel electrode 499 on the substrate 100, so that the pixel electrode 499 can also serve as the second electrode plate of a storage capacitor, thereby simplifying the manufacturing process and reducing the cost. In addition, the pixel electrode 499 is formed of a transparent material, which can increase transmittance of the array substrate 10.

The present application provides an array substrate 10. The array substrate 10 includes a substrate 100, an active portion 200, a first electrode plate 299, a gate insulating portion 300, a gate portion 400, a pixel electrode 499, and an interlayer dielectric layer 500. The active portion 200, the gate insulating portion 300, and the gate portion 400 are formed using a same photomask, which saves a number of photomasks, that is, simplifies a preparation process of the array substrate 10, thereby reducing a cost. The active portion 200, the gate insulating portion 300, and the gate portion 400 are formed using a same photomask, which can prevent other layers in the array substrate from being damaged, thereby improving performance of the array substrate 10. An orthographic projection of the first electrode plate 299 on the substrate 100 is set to fall within an orthographic projection of the pixel electrode 499 on the substrate 100, so that the pixel electrode 499 can also serve as a second electrode plate of a storage capacitor, thereby simplifying the manufacturing process and reducing the cost. In addition, the pixel electrode 499 is formed of a transparent material, which can increase transmittance of the array substrate 10.

The present application also provides a display panel. The display panel includes the array substrate 10 provided in the present application and has all the features described in the present application.

Referring to FIG. 1 to FIG. 15, FIG. 2 is a flowchart of a method of manufacturing an array substrate provided by an embodiment of the present application. The present application also provides a method of manufacturing an array substrate, including:

B11. providing a substrate.

Referring to FIG. 3, a base substrate 110 is provided, and silicon oxynitride is disposed on the base substrate 110 to form a buffer layer 120.

B12. sequentially stacking an active layer, a gate insulating layer, and a gate on the substrate, and patterning the active layer, the gate insulating layer, and the gate with a photomask to form an active portion, a gate insulating portion, and a gate portion, wherein the active portion, the gate insulating portion, and the gate portion are stacked in sequence.

Referring to FIG. 3 to FIG. 6, specifically, physical vapor deposition is used to deposit indium gallium zinc oxide on the buffer layer 120 to form the active layer 201. Then, silicon oxide is deposited on the active layer 201 by chemical vapor deposition to form the gate insulating layer 301. After that, physical vapor deposition is used to deposit a metal on the gate insulating layer 301 to form the gate 401. Then, a photoresist material is coated on the gate 401 and patterned using a halftone photomask for exposure and development. The photoresist material forms a first photoresist 900 and a second photoresist 1000. There is a gap between the first photoresist 900 and the second photoresist 1000. The second photoresist 1000 includes a first portion 1010 and a second portion 1020 disposed around the first portion 1010. A thickness of a vertical section of the first portion 1010 is greater than a thickness of a vertical section of the second portion 1020. A thickness of the second portion 1020 is same as a thickness of the first photoresist 900.

Figure 7:
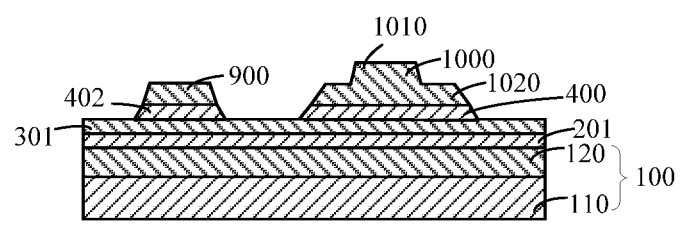
FIG. 7 is a fifth structural flowchart of the method of manufacturing the array substrate provided by an embodiment of the present application.

Referring to FIG. 7, then, the gate 401 is wet-etched, and the gate 401 forms a metal portion 402 and a gate portion 400. There is a gap between the metal portion 402 and the gate portion 400. The metal portion 402 is located directly under the first photoresist 900, and the gate portion 400 is located directly under the second photoresist 1000.

Figure 8:
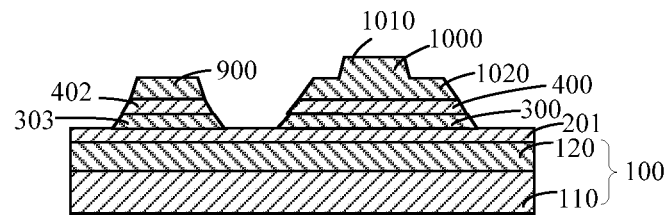
FIG. 8 is a sixth structural flowchart of the method of manufacturing the array substrate provided by an embodiment of the present application.

Referring to FIG. 8, then, the gate insulating layer 301 is dry-etched to form a gate insulating portion 300 and an additional portion 303. There is a gap between the gate insulating portion 300 and the additional portion 303. The additional portion 303 is located directly under the metal portion 402. The gate insulating portion 300 is located directly under the gate portion 400.

Figure 9:
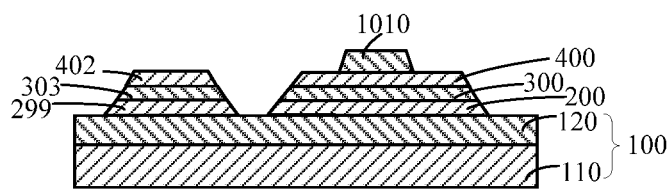
FIG. 9 is a seventh structural flowchart of the method of manufacturing the array substrate provided by an embodiment of the present application.

Referring to FIG. 9, then, the active layer 201 is wet-etched to form the active portion 200 and the first electrode plate 299. There is a gap between the active portion 200 and the first electrode plate 299. The first electrode plate 299 is located directly under the additional portion 303. The active portion 200 is located directly under the gate insulating portion 300.

Still referring to FIG. 9, then, the first photoresist 900 and the second portion 1020 are removed by ashing, and a thickness of the first portion 1010 is correspondingly reduced.

Figure 10:
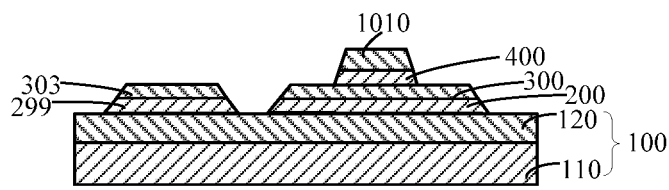
FIG. 10 is an eighth structural flowchart of the method of manufacturing the array substrate provided by an embodiment of the present application.

Referring to FIGS. 9 and 10, then, the metal portion 402 and the gate portion 400 are subjected to a first etching, and the metal portion 402 and a part of the gate portion 400 are removed to expose the additional portion 303 and a part of the gate insulating portion 300. The first etching is wet etching.

Figure 11:
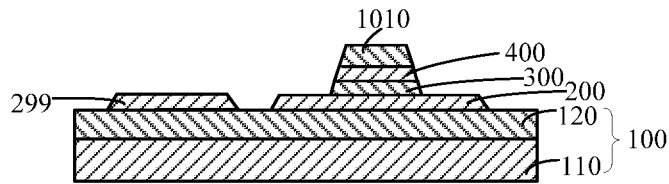
FIG. 11 is a ninth structural flowchart of the method of manufacturing the array substrate provided by the embodiment of the present application.

Referring to FIG. 11, then, the additional portion 303 and the gate insulating portion 300 are subjected to a second etching to remove the additional portion 303 and a part of the gate insulating portion 300. The second etching is dry etching.

Figure 12:
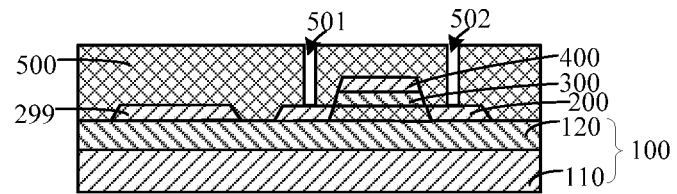
FIG. 12 is a tenth structural flowchart of the method of manufacturing the array substrate provided by the embodiment of the present application.

Referring to FIG. 12, then, the first portion 1010 is removed by ashing, and the part of the active portion 200 exposed by the gate insulating portion 300 and the first electrode plate 299 are subjected to a conductorization treatment to form a semiconductor region covered by the gate insulating portion 300 and a conduction region not covered by the gate insulating portion 300.

B13. providing an interlayer dielectric layer on the substrate, the active portion, the gate insulating portion, and the gate portion.

Referring to FIG. 12, specifically, the interlayer dielectric layer 500 is formed on the substrate 100, the active portion 200, the first electrode plate 299, the gate insulating portion 300, and the gate portion 400 by chemical vapor deposition. The dielectric layer 500 is subjected to a third etching to form a first through hole 501 and a second through hole 502 at the interlayer dielectric layer 500. The first through hole 501 and the second through hole 502 are defined on opposite sides of the gate portion 400, and the first through hole 501 and the second through hole 502 penetrate the interlayer dielectric layer 500 to expose the conduction region of the active portion 200. The third etching is wet etching.

Figure 13:
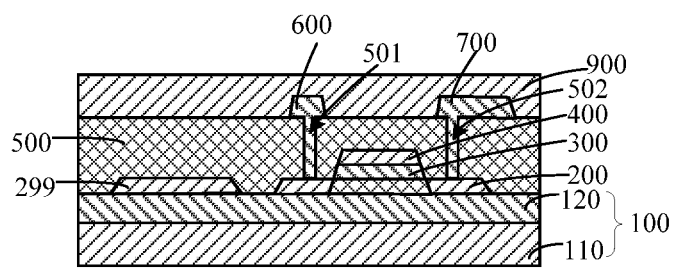
FIG. 13 is an eleventh structural flowchart of the method of manufacturing the array substrate provided by an embodiment of the present application.

In an embodiment, after step B13, the method further includes:

Referring to FIG. 13, a physical vapor deposition method is used to form a metal layer on the interlayer dielectric layer 500, and the metal layer is patterned to form a source 600 and a drain 700. That is, the source 600 and the drain 700 are formed by wet etching. The source 600 and the drain 700 respectively extend into the first through hole 501 and the second through hole 502 to be connected to an upper surface of the conduction region of the active portion 200.

Figure 14:
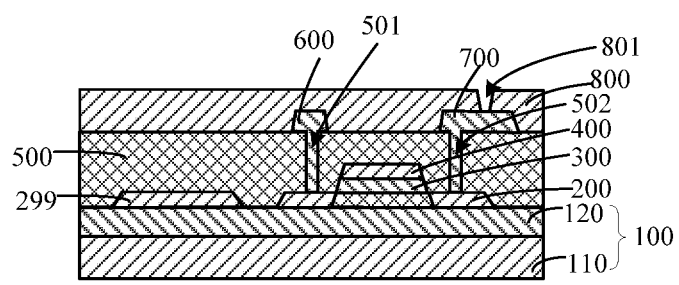
FIG. 14 is a twelfth structural flowchart of the method of manufacturing the array substrate provided by an embodiment of the present application.

Referring to FIGS. 13 and 14, then, a passivation layer 800 is formed by a chemical vapor deposition method on the source 600, the drain 700, and the interlayer dielectric layer 500, and the passivation layer 800 is patterned to form the passivation layer 800 having a third through hole 801. The third through hole 801 penetrates the passivation layer 800 to expose the drain 700.

Figure 15:
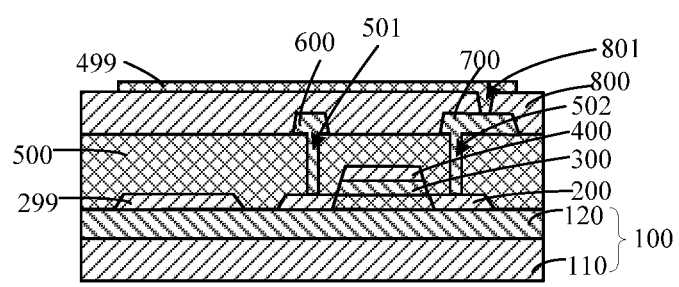
FIG. 15 is a thirteenth structural flowchart of the method of manufacturing the array substrate provided by an embodiment of the present application.
Figure 16:
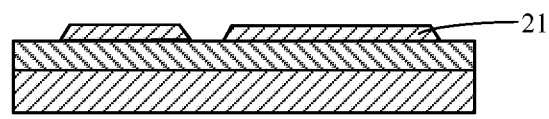
FIG. 16 is a first structural flowchart of a method of manufacturing an array substrate in the prior art.
Figure 17:
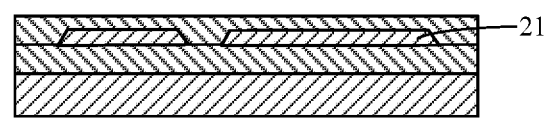
FIG. 17 is a second structure flowchart of the method of manufacturing the array substrate in the prior art.
Figure 18:
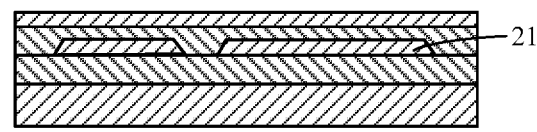
FIG. 18 is a third structure flowchart of the method of manufacturing the array substrate in the prior art.
Figure 19:
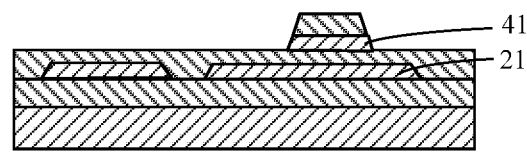
FIG. 19 is a fourth structural flowchart of the method of manufacturing the array substrate in the prior art.
Figure 20:
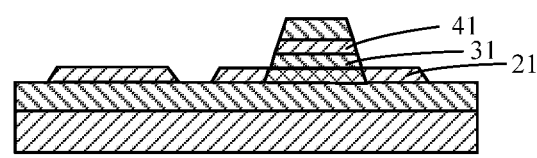
FIG. 20 is a fifth structural flowchart of the method of manufacturing the array substrate in the prior art.
Figure 21:
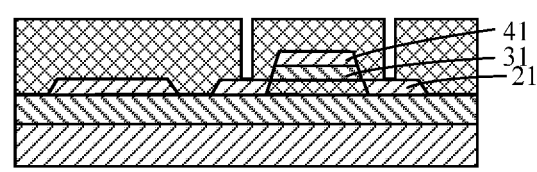
FIG. 21 is a sixth structural flowchart of the method of manufacturing the array substrate in the prior art.
Figure 22:
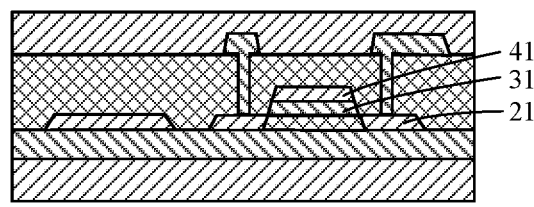
FIG. 22 is a seventh structure flowchart of the method of manufacturing the array substrate in the prior art.
Figure 23:
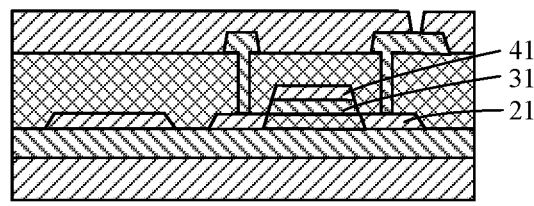
FIG. 23 is an eighth structure flowchart of the method of manufacturing the array substrate in the prior art.
Figure 24:
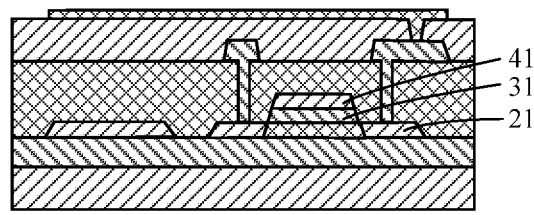
FIG. 24 is a ninth structural flowchart of the method of manufacturing the array substrate in the prior art.

Referring to FIG. 15, then, a conductive layer is deposited on the passivation layer 800 by the physical vapor deposition method, and the conductive layer is patterned to form a pixel electrode 499. That is, the pixel electrode 499 is formed by wet etching. The orthographic projection of the first electrode plate 299 on the substrate 100 falls within the orthographic projection of the pixel electrode 499 on the substrate 100. The pixel electrode 499 can also serve as a second electrode plate of a storage capacitor and the first electrode plate 299 to form the storage capacitor. The conductive layer is made of a transparent conductive material.

Referring to FIGS. 16-24, in the prior art, a method of preparing an array substrate includes: forming a patterned active portion 21 on a buffer layer by using a photomask; then, sequentially stacking a gate insulating layer and a gate on the buffer layer. Next, the gate and the gate insulating layer are patterned by another photomask to form a gate portion 31 and a gate insulating portion 41, respectively, and then an interlayer dielectric layer and a passivation layer are formed on the buffer layer. That is, for the array substrate in the prior art, two photomasks are needed to form the active portion 21, the gate insulating portion 31, and the gate portion 41, that is, the array substrate in the prior art are formed using multiple photomasks, so that the preparation process of the array substrate is complicated, and the production cycle is long, which in turn increases the cost.

In the present application, the active portion 200, the gate insulating portion 300, and the gate portion 400 are formed using a same halftone mask, which saves the photomask and reduces the cost. The orthographic projection of the first electrode plate 299 on the substrate 100 is set to fall within the orthographic projection of the pixel electrode 499 on the substrate 100, so that the pixel electrode 499 can also serve as the second electrode plate of the storage capacitor, thereby simplifying the manufacturing process and reducing the cost. The orthographic projection of the first electrode plate 299 on the substrate 100 is set to fall within the orthographic projection of the pixel electrode 499 on the substrate 100, so the pixel electrode 499 can also serve as the second electrode plate of the storage capacitor. In addition, the pixel electrode 499 is formed of a transparent material, which can increase transmittance of the array substrate 10.

In another embodiment, the active portion 200, the gate insulating portion 300, and the gate portion 400 are formed using a same non-halftone photomask, that is, a normal photomask, and the source 600 and drain 700 are connected to sides of the conductive region of the active portion 200 without impacting a normal operation of the array substrate 10.

The present application discloses an array substrate 10, a method of manufacturing the same, and a display panel. The method of manufacturing the array substrate 10 includes: providing a substrate 100; sequentially stacking an active layer 201, a gate insulating layer 301, and a gate 401 on the substrate 100, and patterning the active layer 201, the gate insulating layer 301, and the gate 401 with a photomask to form an active portion 200, a gate insulating portion 300, and a gate portion 400, wherein the active portion 200, the gate insulating portion 300, and the gate portion 400 are stacked in sequence; and providing an interlayer dielectric layer 500 on the substrate 100, the active portion 200, the gate insulating portion 300, and the gate portion 400. In the present application, the active portion 200, the gate insulating portion 300, and the gate portion 400 are formed by one photomask, thereby simplifying a preparation process of the array substrate 10 and reducing the cost. The orthographic projection of the first electrode plate 299 on the substrate 100 is set to fall within the orthographic projection of the pixel electrode 499 on the substrate 100, so that the pixel electrode 499 can also serve as the second electrode plate of a storage capacitor. In addition, the pixel electrode 499 is formed of a transparent material, which can improve transmittance of the array substrate 10.

The array substrate and the method of manufacturing the same provided by the embodiments of the present application are described in detail above. Specific examples are used to explain the principle and implementation of the present application. The descriptions of the above embodiments are only used to help understand the present application. Also, for those skilled in the art, according to the ideas of the present application, there will be changes in the specific implementation and application scope. In summary, the content of this specification should not be construed as limiting the present application.

What is claimed is:

1. A method of manufacturing an array substrate, comprising:

providing a substrate;

sequentially stacking an active layer, a gate insulating layer, and a gate on the substrate;

coating a photoresist material on the gate;

patterning the photoresist material with one same photomask to form a first photoresist and a second photoresist spaced apart;

etching the gate, the gate insulating layer and the active layer sequentially to form a gate portion, a gate insulating portion, and an active portion, wherein the active portion, the gate insulating portion, and the gate portion are stacked in sequence; and a portion of the active layer which is directly under the first photoresist forms a first electrode plate, and a portion of the active layer which is directly under the second photoresist forms the active portion;

providing an interlayer dielectric layer on the substrate, the active portion, the gate insulating portion, and the gate portion; and providing a pixel electrode on the interlayer dielectric layer, wherein orthographic projections of both the first electrode plate and the active portion on the substrate are within an orthographic projection of the pixel electrode on the substrate.

2. The method of manufacturing the array substrate according to claim 1, wherein the step of forming the active portion, the gate insulating portion, and the gate portion comprises:

sequentially stacking the active layer, the gate insulating layer, and the gate on the substrate and patterning the active layer, the gate insulating layer, and the gate with a photomask, wherein the gate insulating layer forms the gate insulating portion and an additional portion; the gate forms a metal portion and the gate portion; and the active portion, the gate insulating portion, and the gate portion are stacked in sequence; the first electrode plate, the additional portion, and the metal portion are stacked in sequence; the active portion, the gate insulating portion, and the gate portion are spaced apart from the first electrode plate, the additional portion, and the metal portion by a gap; and removing the additional portion and the metal portion.

3. The method of manufacturing the array substrate according to claim 2, wherein the step of removing the additional portion and the metal portion comprises:

performing a first etching on the gate portion and the metal portion and removing the metal portion and a part of the gate portion to expose the additional portion and a part of the gate insulating portion; and performing a second etching on the additional portion and the gate insulating portion to remove the additional portion and the part of the gate insulating portion to expose the first electrode plate and a part of the active portion.

4. The method of manufacturing the array substrate according to claim 3, wherein after exposing the first electrode plate and the part of the active portion, the method further comprises:

performing a conductorization treatment on the first electrode plate and the part of the active portion to form a semiconductor region laminated with the gate insulating portion and a conduction region arrange around the semiconductor region on the active portion.

5. The method of manufacturing the array substrate according to claim 4, wherein after providing the interlayer dielectric layer on the substrate, the active portion, the gate insulating portion, and the gate portion, the method further comprises:

performing a third etching on the interlayer dielectric layer to form a first through hole and a second through hole in the interlayer dielectric layer, wherein the first through hole and the second through hole are defined at opposite sides of the gate portion, and the first through hole and the second through hole penetrate the interlayer dielectric layer to expose the conduction region of the active portion.

6. The method of manufacturing the array substrate according to claim 5, wherein after the step of performing the third etching treatment on the interlayer dielectric layer, the method further comprises:

forming a metal layer on the interlayer dielectric layer and patterning the metal layer to form a source and a drain, wherein the source extends into the first through hole to connect the active portion, and the drain extends into the second through hole to connect the active portion; and forming a passivation layer on the interlayer dielectric layer, the source, and the drain and performing a fourth etching on the passivation layer to form a third through hole in the passivation layer, wherein the third through hole penetrates the passivation layer to expose the drain.

7. The method of manufacturing the array substrate according to claim 6, wherein after the step of performing the fourth etching on the passivation layer, the method further comprises:

forming a conductive layer on the passivation layer and patterning the conductive layer to form the pixel electrode, wherein the pixel electrode extends into the third through hole to connect the drain.

8. The method of manufacturing the array substrate according to claim 3, wherein the first etching is wet etching.

9. The method of manufacturing the array substrate according to claim 3, wherein the second etching is dry etching.

10. The method of manufacturing the array substrate according to claim 1, wherein the step of providing the substrate comprises:

providing a base substrate and forming a buffer layer on the base substrate.

11. The method of manufacturing the array substrate according to claim 1, wherein a material of the gate insulating layer comprises one or a combination of silicon nitride, aluminum oxide, silicon oxynitride, and silicon oxide.

12. The method of manufacturing the array substrate according to claim 1, wherein a material of the gate comprises one or a combination of Mo, Cu, Al, and Ti.

* * * * *